United States Patent [19]
Yoo et al.

[11] Patent Number: 5,885,744
[45] Date of Patent: Mar. 23, 1999

[54] PHOTORESIST COMPOSITION

[75] Inventors: Seung-joon Yoo; Ik-chul Lim; Chang-wook Kim, all of Suwon; Ki-wook Kang, Seongnam, all of Rep. of Korea

[73] Assignee: Samsung Display Devices Co., Ltd., Kyungki-do, Rep. of Korea

[21] Appl. No.: 892,442

[22] Filed: Jul. 14, 1997

[30] Foreign Application Priority Data

Jul. 16, 1996 [KR] Rep. of Korea ................. 96-28854

[51] Int. Cl.$^6$ .................... G03F 7/012; G03C 5/00
[52] U.S. Cl. ................ 430/196; 430/28; 430/167; 430/197
[58] Field of Search .................. 430/196, 197, 430/28, 167

[56] References Cited

U.S. PATENT DOCUMENTS

| | | | |
|---|---|---|---|
| 4,019,907 | 4/1977 | Tsunoda et al. | 430/196 |
| 4,191,571 | 3/1980 | Nonogaki et al. | 430/335 |
| 4,332,874 | 6/1982 | Hayashi et al. | 430/28 |

FOREIGN PATENT DOCUMENTS

| | | |
|---|---|---|
| 0 779 553 | 6/1997 | European Pat. Off. . |
| 2 148 216 | 3/1972 | Germany . |

OTHER PUBLICATIONS

Patent Abstracts of Japan, Publn. No. 01173028, Jul. 1989.
Patent Abstracts of Japan, Publn. No. 07120920, May 1995.
Patent Abstracts of Japan, Publn. No. 57132139, Aug. 1982.
Patent Abstracts of Japan, Publn. No. 57146247, Sep. 1982.
Database WPI, No. XP002045823, Oct. 1976.
Database WPI, No. X002045824, Jul. 1974.

*Primary Examiner*—John S. Chu
*Attorney, Agent, or Firm*—Lowe Hauptman Gopstein Gilman & Berner

[57] ABSTRACT

A photoresist composition containing a photo-curing polymer and a photosensitive agent, wherein the photosensitive agent comprises at least two compounds selected from the group consisting of 4,4'-diazido-2,2'-stilbenedisulfonate sodium salt, 4,4'-diazo-2,2'-dibenzalacetone disulfonate disodium salt, 2,5-bis(4-azido-2-sulfobenzylidene) cyclopentanone disodium salt and 4,4'-diazido-2,2'-dicinnamylideneacetone sulfonate salt. By performing a lithography process using the photoresist composition, the exposure time can be shortened, thereby improving the yield of products.

7 Claims, 1 Drawing Sheet

PHOTORESIST COMPOSITION

BACKGROUND OF THE INVENTION

The present invention relates to a photoresist composition, and more particularly, to a photoresist composition which can be used for forming a black matrix pattern for a cathode ray tube by using a lithography process and which can obtain a sufficient hardening effect even in a short exposure time.

In general, in the screen of a color cathode ray tube, green, blue and red-emitting phosphor patterns are arranged regularly in a dot or stripe form. Also, in order to improve contrast and color purity of the screen, a black matrix is formed between the respective phosphor patterns. The block matrix is generally formed by using a lithography process, like in forming the phosphor patterns.

The lithography process is comprised of the steps of coating, exposing and developing the photoresist. Here, the photoresist is divided into a positive type and a negative type, which is selectively used in consideration of the required sensitivity, shape and resolution of a pattern to be formed, and coherence to a substrate.

In more detail, in the case of using a positive photoresist, a slurry of photoresist and graphite is first manufactured. Next, the slurry is coated on the inner surface of a CRT panel, a shadow mask is provided, and then the slurry is exposed and developed to form a black matrix pattern.

However, in the case of using a negative photoresist, if the same method is used as in the case of the positive photoresist, the black matrix pattern may be formed at the portion where the phosphor patterns are to be formed. Accordingly, a process different from that using a positive photoresist must be adopted for forming the black matrix pattern.

In other words, a negative photoresist composition not containing graphite is coated on the inner surface of a CRT panel and then exposed and developed to form a resin pattern at the exposed portions where the phosphor patterns are to be formed. Graphite is coated on the resin pattern formed surface and then the resin pattern is etched using sulfuric acid, thereby forming the black matrix pattern.

The negative photoresist composition contains a photo-curing polymer resin and a photosensitive agent dissolved in an organic solvent. As the photosensitive agent, one of 4,4'-diazido-2,2'-stilbenedisulfonate sodium salt (DAS) is mainly used.

The photosensitive agent is sensitive to light and functions as a cross linking agent. If the negative photoresist is coated and then light is irradiated for a predetermined time, the photoresist is hardened by the cross linking reaction of the polymer with the photosensitive agent. Here, in order to reduce the time of the lithography process, it is necessary to shorten the exposure time. For this purpose, it is necessary to develop a photoresist having excellent photo-reactivity.

SUMMARY OF THE INVENTION

It is an object of the present invention to provide a photoresist composition having excellent photo-reactivity so as to provide a sufficient cross linking reaction in a short exposure time, which makes it easy for the photoresist composition to be adopted to a lithography process.

To accomplish the object of the present invention, there is provided a photoresist composition containing a photo-curing polymer and a photosensitive agent, wherein the photosensitive agent comprises at least two compounds selected from the group consisting of 4,4'-diazido-2,2'-stilbenedisulfonate sodium salt, 4,4'-diazo-2,2'-dibenzalacetone disulfonate disodium salt, 2,5-bis(4-azido-2-sulfobenzylidene) cyclopentanone disodium salt and 4,4'-diazido-2,2'-dicinnamylideneacetone sulfonate salt.

Preferably, the content of the photosensitive agent is 1~20 wt % based upon the weight of the photo-curing polymer.

BRIEF DESCRIPTION OF THE DRAWINGS

The above objects and advantages of the present invention will become more apparent by describing in detail preferred embodiments thereof with reference to the attached drawing in which.

DETAILED DESCRIPTION OF THE INVENTION

Figure 1:
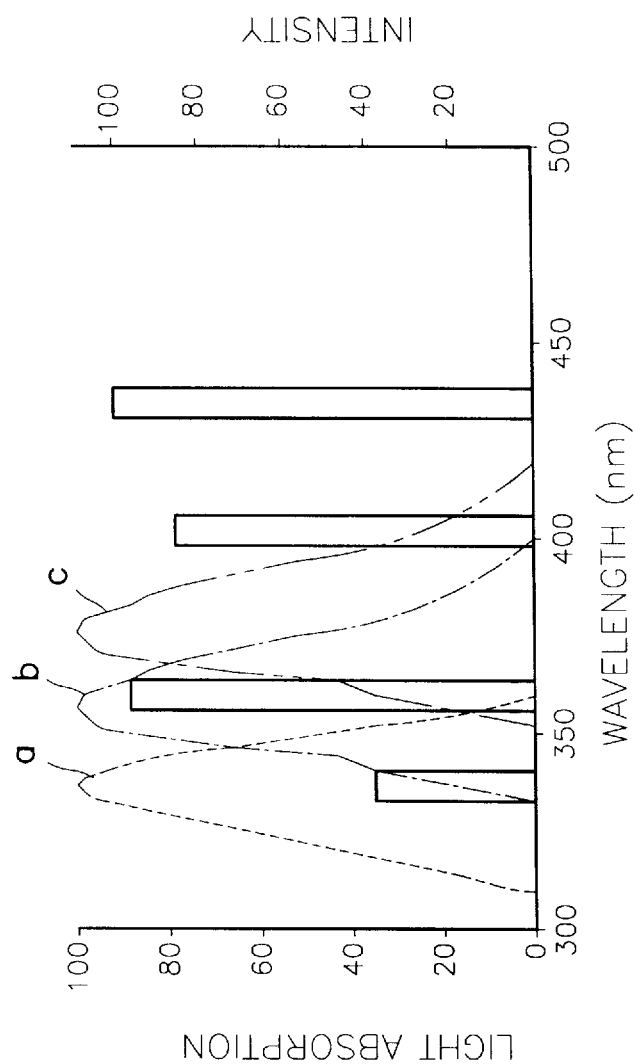
FIG. 1 is a graph showing peaks of the light absorbed by widely adopted photosensitive agents and peaks of the light irradiated from a mercury lamp.

In order to solve the problems caused by using a single photosensitive agent which requires a long exposure time, several kinds of photosensitive agents are used in combination in the present invention. The photosensitive agent adopts a mixture of at least two compounds selected from the group consisting of 4,4'-diazido-2,2'-stilbenedisulfonate sodium salt (DAS),4,4'-diazo-2,2'-dibenzalacetone disulfonate disodium salt (DAB), 2,5-bis (4-azido-2-sulfobenzylidene) cyclopentanone disodium salt(DAP) or 4,4'-diazido-2,2'-dicinnamylideneacetone sulfonate salt (DACA).

FIG. 1 is a graph showing peaks of light absorbed by the above-mentioned photosensitive agents and peaks of the light irradiated from a mercury lamp. In FIG. 1, curves a, b and c indicate light absorption of DAS, DAB and DAP which have the different light absorbing wavelength regions, though the repective light aborbing capacity is similar. Also, the four bars indicate major peaks of the light irradiated from a mercury lamp, where the intensity at wavelengths 335 nm, 365 nm and 405 nm are compared to that at wavelengths 436 nm.

As can be seen from FIG. 1, the light irradiated from a light source cannot be efficiently utilized with only one photosensitive agent. Accordingly, in the present invention, there is provided a photoresist composition containing various kinds of photosensitive agents to absorb the various wavelength regions, so that the light is efficiently utilized to shorten the exposure time. In the present invention, there is no special restriction in the photo-curing polymer which can be used for the photoresist composition. However, polyvinyl pyrrolidone or poly (acrylaminde-co-diacetoneacrylamide) is preferred. In this case, the weight ratio of the photo-curing polymer and the photosensitive agent is preferred to be 1:0.01 to 1:0.20.

According to the present invention, it is preferable that the photosensitive agent in the photoresist composition is essentially composed of 4,4'-diazido-2,2'-stilbenedisulfonate sodium salt and further contains at least one of the other photosensitive agents. In this case, 4,4'-diazido-2,2'-stilbenedisulfonate sodium salt is preferably 10~90 wt % based upon the total weight of the photosensitive agent.

Also, it is preferable that a metal nitrite is included in the photoresist composition according to the present invention. The metal nitrite functions as a reducing agent and prevents oxidation of the photo-curing polymer. Thus, if metal nitrite is contained in the photoresist composition, it is possible to solve the problem of gradual lowering of the viscosity and sensitivity of the photoresist composition with a passing of time. In the present invention, the content of the metal nitrite is preferably 0.1~20 wt % based upon the weight of the photo-curing polymer, and more preferably 0.5~5 wt %. If the content of the metal nitrite is less than 0.1 wt %, the oxidation preventing effect of the photo-curing polymer is poor. If the content of the metal nitrite is greater than 20 wt %, it is difficult to form a good black matrix pattern. As the metal nitrite, it is preferable to adopt sodium nitrite, potassium nitrite, ammonium nitrite or magnesium nitrite.

Hereinbelow, the effect of the present invention will be explained in detail with reference to illustrative examples, but the present invention is not limited thereto.

EXAMPLE 1

The following ingredients were mixed and stirred for 2 hours to prepare a photoresist composition.

Photoresist composition

PVP 2.7 g

DAS 0.405 g

DAB 0.216 g

Silane coupling agent (A1120) 0.027 g

Pure water 96.68 g

The prepared composition was spin-coated on a 14" panel and dried to form a thin film, and a 0.028 DOT mask was installed thereon, and then the thin film was exposed to light for 13 seconds using a ultra high-pressure mercury lamp. Then, the resultant film was developed with pure water to remove the non-exposed portion thereof, thereby forming a resin pattern. Subsequently, graphite was spin-coated on the panel where the resin pattern was formed, and the resultant structure was dried, dipped into 6% aqueous sulfuric acid for 1 minute, and then developed using pure water under high pressure. As the result of taking a scanning electron microscopy (SEM) photograph with respect to the panel plane, a strong black matrix of 110 $\mu$m dots was formed.

EXAMPLE 2

The following ingredients were used in this example, and the same procedure as that in Example 1 was performed except that exposure was performed for 11 seconds, thereby forming a strong black matrix of 110 $\mu$m dots.

Photoresist composition

PVP 2.7 g

DAS 0.405 g

DAP 0.216 g

Silane coupling agent (A1120) 0.027 g

Pure water 96.68 g

EXAMPLE 3

The following ingredients were used in this example, and the same procedure as that in Example 1 was performed except that exposure was performed for 11 seconds, thereby forming a strong black matrix of 110 $\mu$m dots.

Photoresist composition

PVP 2.7 g

DAS 0.405 g

DACA 0.216 g

Silane coupling agent (A1120) 0.027 g

Pure water 96.68 g

EXAMPLE 4

The following ingredients were used in this example, and the same procedure as that in Example 1 was performed except that exposure was performed for 9 seconds, thereby forming a matrix of strong 110 $\mu$m black dots.

Photoresist composition

PVP 2.7 g

DAS 0.405 g

DAB 0.216 g

DAP 0.216 g

Silane coupling agent (A1120) 0.027 g

Pure water 96.464 g

COMPARATIVE EXAMPLE

The following ingredients were used in this example, and the same procedure as that in Example 1 was performed except that exposure was performed for 10 seconds. As the result of taking a scanning electron microscopy (SEM) photograph with respect to the panel plane, a black matrix having non-uniform sized dots of 60~80 $\mu$m was formed. This is because the photoresist was not sufficiently cross-linked during the exposure process so that a resin pattern having the desired size and shape was not formed. Thus, the black matrix formed by this composition had small and non-uniform sized dots.

Photoresist composition

PVP 2.7 g

DAS 0.405 g

Silane coupling agent (A1120) 0.027 g

Pure water 96.86 g

In comparing the above-described examples with the comparative example, it is evident that much exposure time is required for forming a black matrix having the desired dot size and shape in the case of using a single photosensitive agent.

As described above, the exposure time can be shortened by adopting a lithography process using a photoresist composition according to the present invention, thereby improving the yield of products.

What is claimed is:

1. A photoresist composition containing a photo-curing polymer and a photosensitive agent, wherein said photosensitive agent comprises at least two compounds selected from the group consisting of 4,4'-diazido-2,2'-stilbenedisulfonate sodium salt, 4,4'-diazo-2,2'-dibenzalacetone disulfonate disodium salt, 2,5-bis(4-azido-2-sulfobenzylidene) cyclopentanone disodium salt and 4,4'-diazido-2,2'-dicinnamylideneacetone sulfonate salt and a metal nitrite.

2. A photoresist composition as claimed in claim 1, wherein said photo-curing polymer is selected from the group consisting of polyvinyl pyrolidone and poly (acrylaminde-co-diacetoneacrylamide).

3. A photoresist composition as claimed in claim 1, wherein the content of said photosensitive agent is 1~20 wt % based upon the weight of said photo-curing polymer.

4. A photoresist composition as claimed in claim 1, wherein said photosensitive agent comprises 4,4'-diazido-2, 2'-stilbenedisulfonate sodium salt and at least one compound selected from the group consisting of 4,4'-diazo-2,2'-dibenzalacetone disulfonate disodium salt, 2,5-bis(4-azido-2-sulfobenzylidene) cyclopentanone disodium salt and 4,4'-diazido-2,2'-dicinnamylideneacetone sulfonate salt.

5. A photoresist composition as claimed in claim 4, wherein the content of said 4,4'-diazido-2,2'-stilbenedisulfonate sodium salt is 10~90 wt % based upon the total weight of said photosensitive agent.

6. A photoresist composition as claimed in claim 1, wherein said metal nitrite is selected from the group consisting of sodium nitrite, potassium nitrite, ammonium nitrite and magnesium nitrite.

7. A photoresist composition as claimed in claim 1, wherein the content of said metal nitrite is 0.1~20 wt % based upon the weight of said photo-curing polymer.

* * * * *